(12) United States Patent
Yamazaki et al.

(10) Patent No.: US 7,446,392 B2
(45) Date of Patent: Nov. 4, 2008

(54) ELECTRONIC DEVICE AND METHOD FOR MANUFACTURING THE SAME

(75) Inventors: Shunpei Yamazaki, Tokyo (JP); Satoshi Teramoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 11/942,346

(22) Filed: Nov. 19, 2007

(65) Prior Publication Data

US 2008/0075887 A1    Mar. 27, 2008

Related U.S. Application Data

(60) Division of application No. 11/142,300, filed on Jun. 2, 2005, now Pat. No. 7,298,021, which is a continuation of application No. 10/155,326, filed on May 23, 2002, now Pat. No. 6,940,094, which is a division of application No. 09/302,679, filed on Apr. 30, 1999, now Pat. No. 6,979,882, which is a continuation of application No. 08/895,432, filed on Jul. 16, 1997, now Pat. No. 5,929,527.

(30) Foreign Application Priority Data

Jul. 16, 1996  (JP)  .................................. 8-205417

(51) Int. Cl.
  *H01L 29/00* (2006.01)
(52) U.S. Cl. .................. 257/559; 257/643; 257/644; 257/711; 257/765; 257/767; 257/E21.413; 257/E21.414; 257/E29.151; 257/E29.278
(58) Field of Classification Search .................. None
  See application file for complete search history.

(56) References Cited

U.S. PATENT DOCUMENTS

| | | | |
|---|---|---|---|
| 5,430,320 A | 7/1995 | Lee |
| 5,594,280 A | 1/1997 | Sekiguchi |
| 5,686,328 A | 11/1997 | Zhang |
| 5,710,606 A | 1/1998 | Nakajima |
| 5,736,434 A | 4/1998 | Konuma |
| 5,744,824 A | 4/1998 | Kousai |

(Continued)

FOREIGN PATENT DOCUMENTS

JP    63-076321    4/1988

(Continued)

OTHER PUBLICATIONS

Case No. C 02-02800 WHA; Acer Incorporated and Acer America Corporation's Motion for Summary Judgment of Anticipation of 5,929,527 Patent; pp. 1-8; Jul. 9, 2003.

(Continued)

*Primary Examiner*—David E Graybill
(74) *Attorney, Agent, or Firm*—Fish & Richardson P.C.

(57) ABSTRACT

An electronic device is provided using wiring comprising aluminum to prevent hillock or whisker from generating, wherein the wiring contains oxygen atoms at a concentration of $8 \times 10^{18}$ atoms·cm$^{-3}$ or less, carbon atoms at a concentration of $5 \times 10^{18}$ atoms·cm$^{-3}$ or less, and nitrogen atoms at a concentration of $7 \times 10^{17}$ atoms·cm$^{-3}$ or less; furthermore, a silicon nitride film is formed on the aluminum gate, and an anodic oxide film is formed on the side planes thereof.

24 Claims, 9 Drawing Sheets

U.S. PATENT DOCUMENTS

| | | | |
|---|---|---|---|
| 5,888,858 | A | 3/1999 | Yamazaki |
| 5,929,527 | A | 7/1999 | Yamazaki |
| 5,985,740 | A | 11/1999 | Yamazaki |
| 6,077,731 | A | 6/2000 | Yamazaki |
| 6,100,562 | A | 8/2000 | Yamazaki |
| 6,198,133 | B1 | 3/2001 | Yamazaki |
| 6,808,965 | B1 | 10/2004 | Miyasaka |
| 7,081,938 | B1 | 7/2006 | Yamazaki |
| 2006/0256273 | A1 | 11/2006 | Yamazaki |

FOREIGN PATENT DOCUMENTS

| | | |
|---|---|---|
| JP | 63-092172 | 4/1988 |
| JP | 01-228175 | 9/1989 |
| JP | 03-014227 | 1/1991 |
| JP | 03-174123 | 7/1991 |
| JP | 03-263639 | 12/1991 |
| JP | 05-206466 | 8/1993 |
| JP | 07-209672 | 8/1995 |
| JP | 07-226515 | 8/1995 |
| JP | 08-006053 | 1/1996 |
| JP | 08-122814 | 5/1996 |
| JP | 08-153728 | 6/1996 |

OTHER PUBLICATIONS

Case No. C 02-02800 WHA; Declaration of Peter J. Wied in Support of Acer Incorporated and Acer America Corporation's Motion for Summary Judgment of Anticipation of U.S. Patent No. 5,929,527 Patent; pp. 1-4; Jul. 9, 2003.
True and correct U.S. Patent No. 5,929,527 (Exhibit A of Declaration of Peter J. Wied).
Case No. C 02-02800 WHA; Final Claim-Construction Order For United States Patent Nos. 5,929,527, 6,355,941, 6,404,476, and 6,404,480; pp. 1-14, and Certificate of Service, pp. 1-3; Jun. 9, 2003 (Exhibit B of Declaration of Peter J. Wied).
True and correct U.S. Patent No. 5,485,019 (Exhibit C of Declaration of Peter J. Wied).
Webster's II New College Dictionary, Houghton Mifflin Company; 3 pages including cover page, copyright page, and p. 899; Copyright 2001, 1999, 1995 (Exhibit D of Declaration of Peter J. Wied).
Case No. C 02-02800 WHA; SEL's Opposition to Acer's Motion for Summary Judgment of Anticipation of U.S. Patent No. 5,929,527; Cover and pp. 1-8; Jul. 23, 2003.
Case No. C 02-02800 WHA; Declaration of L. Rafael Reif in Support of SEL's Opposition to Acer's Motion for Summary Judgment of Anticipation of U.S. Patent No. 5,929,527; pp. 1-4; Jul. 18, 2003.
Case No. C 02-02800 WHA; Declaration of Donald R. Harris in Support of SEL's Oppositions to the Five Summary Judgment Motions of AU and Acer; pp. 1-4; Jul. 23, 2003.
True and correct U.S. Patent No. 5,929,527 (Exhibit 2 of Declaration of Donald R. Harris).
True and correct U.S. Patent No. 5,485,019 (Exhibit 3 of Declaration of Donald R. Harris).
Wolf et al.; "Aluminium Thin Films and Physical Vapor Deposition in VLSI"; Silicon Processing for VLSI Era, Chapter 10; pp. 331-334; 1986 (Exhibit 4 of Declaration of Donald R. Harris).
Case No. C 02-02800 WHA; Acer Incorporated's Answer to First Amended Complaint for Patent Infringement and Counterclaims; pp. 1-11; Sep. 24, 2002 (Exhibit 5 of Declaration of Donald R. Harris).
Case No. C 02-02800 WHA; Case Management Order for Patent Case and Reference to Magistrate Judge for Settlement/Mediation; pp. 1-4; Sep. 11, 2002 (Exhibit 6 of Declaration of Donald R. Harris).
Case No. C 02-02800 WHA; Acer Incorporated and Acer America Corporation's Reply in Support of It's Motion For Summary Judgment of Anticipation of U.S. Patent No. 5,929,527; pp. 1-7; Jul. 29, 2003.
Case No. C 02-02800 WHA; Supplemental Declaration of Peter J. Weid in Support of Acer Incorporated and Acer America Corporation's Motion for Summary Judgment of Anticipation of U.S. Patent No. 5,929,527; pp. 1-4; Jul. 29, 2003.
Case No. C 02-02800 WHA; List of Issues on Which Plaintiff SEL will Offer Expert Testimony; pp. 1-4; Apr. 25, 2003 (Exhibit A of Declaration of Peter J. Wied).
Case No. C 02-02800 WHA; Videotape Deposition of Leo Rafael Reif, Ph.D. (word index); cover page and pp. 70-72 and p. 81; Feb. 18, 2003 (Exhibit B of Declaration of Peter J. Wied).
True and correct U.S. Patent No. 4,951,601 (Exhibit C of Declaration of Peter J. Wied).
Case No. C 02-02800 WHA; Case Management Order for Patent Case and Reference to Magistrate Judge for Settlement/Mediation; pp. 1-4; Sep. 11, 2002 (Exhibit D of Declaration of Peter J. Wied).
Case No. C 02-02800 WHA; Notice of Motion and SEL's Motion for Partial Summary Judgment on Defenses of Defendants; Memorandum of Points and Authorities (Redacted Version); pp. i-iii and pp. 1-18; Jul. 9, 2003.
Case No. C 02-02800 WHA; Declaration of Stanley A. Schlitter in Support of SEL's Two Motions for Partial Summary Judgment (Redacted Version); pp. 1-6; Jul. 9, 2003.
True and correct U.S. Patent No. 5,929,527 (Exhibit 22 of Declaration of Stanley A. Schlitter).
Case No. C 02-02800 WHA; Complaint for Patent Infringement—Demand for Jury Trial; pp. 1-7; Jun. 11, 2002 (Exhibit 23 of Declaration of Stanley A. Schlitter).
Case No. C 02-02800 WHA; Acer Incorporated and Acer America Corporation's Final Invalidity Contentions Pursuant to Patent Local Rule 3-6(B); pp. 1-2; Aug. 1, 2003.
Case No. C 02-02800 WHA; Exhibit A of Acer's Final Invalidity Contentions Pursuant to Patent Local Rule 3-6(B); pp. 1-4; Aug. 1, 2003.
Case No. C 02-02800 WHA; Supplemented Final Invalidity Contentions of AU Optronics Corporation Pursuant to Patent L.R. 3-6(b)(1); pp. 1-7; Aug. 4, 2003 with Appendixes 1-6 (listed separately below).
Case No. C 02-02800 WHA; Supplemented Final Invalidity Contentions of AU Optronics Corporation Pursuant to Patent L.R. 3-6(b)(1); Appendix 1: Prior Art for Supplemented Final Invalidity Contentions—U.S. Patent No. 5,929,527; p. 1.
Case No. C 02-02800 WHA; Supplemented Final Invalidity Contentions of AU Optronics Corporation Pursuant to Patent L.R. 3-6(b)(1); Appendix 2: Claim Charts for Supplemented Final Invalidity Contentions—U.S. Patent No. 5,929,527; p. 1.
Case No. C 02-02800 WHA; Supplemented Final Invalidity Contentions of AU Optronics Corporation Pursuant to Patent L.R. 3-6(b)(1); Appendix 3: Prior Art for Supplemented Final Invalidity Contentions—U.S. Patent No. 6,355,941; pp. 1-4.
Case No. C 02-02800 WHA; Supplemented Final Invalidity Contentions of AU Optronics Corporation Pursuant to Patent L.R. 3-6(b)(1); Appendix 4: Claim Charts for Supplemented Final Invalidity Contentions—U.S. Patent No. 6,355,941; pp. 1-61.
Case No. C 02-02800 WHA; Supplemented Final Invalidity Contentions of AU Optronics Corporation Pursuant to Patent L.R. 3-6(b)(1); Appendix 5: Prior Art for Supplemented Final Invalidity Contentions—U.S. Patent No. 6,404,480; pp. 1-2.
Case No. C 02-02800 WHA; Supplemented Final Invalidity Contentions of AU Optronics Corporation Pursuant to Patent L.R. 3-6(b)(1); Appendix 6: Claim Charts for Supplemented Final Invalidity Contentions—U.S. Patent No. 6,404,480; pp. 1-11.
Expert Witness Report of Ian D. Hutcheon, pp. 1-7, May 23, 2003.
Prosecution History of U.S. Patent 5,929,527 (Exhibit 2 of Expert Witness Report of Ian D. Hutcheon; U.S. Patent 5,929,527 is Exhibit 1).
Data Sheets from Charles Evans and Associates for each of the three implant standards—C, N and O, all implanted into A1 (Exhibit 3 of Expert Witness Report of Ian D. Hutcheon).
My Laboratory notebook of Ian D. Hutcheon for the two days of SIMS analysis at Fibics, May 15 & 16, 2003 (Exhibit 4 of Expert Witness Report of Ian D. Hutcheon).
Jochonia Nxumalo, A Non-Infringement Analysis of Acer L150X28 LCD Panel with Respect to U.S. Patent No. 5,929,527, Semiconductor Insights, May 2003 (Exhibit 5 of Expert Witness Report of Ian D. Hutcheon).
Jochonia Nxumalo, A Prior Art Analysis of U.S. Patent No. 5,929,527 on the Intel A80502-120 SX994 Pentium Microprocessor (Exhibit 6 of Expert Witness Report of Ian D. Hutcheon).

Jochonia Nxumalo, A Prior Art Analysis of U.S. Patent No. 5,929,527 on the Intel A80502-75 SX969 Pentium Microprocessor (Exhibit 7 of Expert Witness Report of Ian D. Hutcheon).
Jochonia Nxumalo, A Prior Art Analysis of U.S. Patent No. 5,929,527 on the Intel A80502-90 SX879 Pentium Microprocessor (Exhibit 8 of Expert Witness Report of Ian D. Hutcheon).
Wilson, Stevie and Magee, "Secondary Ion Mass Spectrometry", John Wiley & Sons, 1989 (Exhibit 9 of Expert Witness Report of Ian D. Hutcheon).
Rebuttal Report of Dr. Charles William Magee, pp. 1-25 and Exhibit A pp. 1-2, Jun. 6, 2003.
Reply Report of Ian D. Hutcheon, pp. 1-6, Jun. 13, 2003.
Supplemental Rebuttal Report of Dr. Charles William Magee, pp. 1-11 and Exhibit A pp. 1-3, Jun. 18, 2003.
C.W. Kim et al., "Pure Al and Al-Alloy Gate Line Processes in TFT-LCDs", Technical Digest of the Society for Information Display International Symposium, pp. 337-340, 1996.
Letter by Laurence H. Pretty, Apr. 17, 2003, Exhibit 1 pp. 1-2, Exhibit 2 p. 1, Exhibit 3 p. 1, Exhibit 4 p. 1, Exhibit 5 p. 1, and Exhibit 6 p. 1.
Plaintiff SEL's Response to Defendant AU Optronics' First Request for Admission (No. 1), May 16, 2003.
Case No. C 02-02800 WHA; *Final Claim-Constrction Order for United States Patent Nos. 5,929,527, 6,366,941, 6,404,476, and 6,404,480*; 17 pages; Jun. 9, 2003 (filed Jun. 11, 2003).
Case No. C 02-02800 WHA (EMC); *Final Invalidity Contentions of AU Optronics Corporation*; 68 pages; Jun. 20, 2003.
SEL's Opening Brief on Claim Construction and Supporting Evidence (Mar. 4, 2003).
[Proposed] Order on Claim Construction (Mar. 4, 2003).
Declaration of L. Rafael Reif in Support of SEL's Opening Brief on Claim Construction and Supporting Evidence (Mar. 4, 2003).
Declaration of Donald R. Harris in Support of SEL's Opening Brief on Claim Construction and Supporting Evidence (Mar. 4, 2003).
SEL's Amended Opening Brief on Claim Construction and Supporting Evidence (Mar. 4, 2003).
Declaration of Brian D. Henri regarding SEL's Amended Opening Brief on Claim Construction and Supporting Evidence (Mar. 7, 2003).
Acer Incorporated and Acer Corporation's Opposition Brief on Claim Construction (Mar. 18, 2003).
Declaration of Peter J. Wied in Support of Acer Incorporated and Acer America Corporation's Opposition Brief on Claim COnstruction (Mar. 18, 2003).
[Proposed] Order Re: Claim Construction (Mar. 18, 2003).
Response of Defendant AU Optronics' to SEL's Amended Opening Brief on Claim Construction and Supporting Evidence (Mar. 19, 2003).
Notice of Filing the Declaration of Virginia Rohrabaugh in Support of the Response of Defendant AU Optronics' to SEL's Amended Opening Brief on Claim Construction and Supporting Evidence and Exhibits (Mar. 19, 2003).
SEL's Reply Brief on Claim Construction and Supporting Evidence (Mar. 26, 2003).
Corrected Response of Defendant AU Optronics' to SEL's Amended Opening Brief on Claim Construction and Supporting Evidence (Apr. 7, 2003).
Notice of Filing the Declaration of Virginia Rohrabaugh in Support of the Corrected Response of Defendant AU Optronics' to Sel's Amended Opening Brief on Claim Construction and Supporting Evidence and Exhibits (Apr. 7, 2003).
Tentative Claim Connstruction Order for United States Patent Nos. 5,929,527, 6,355,941, 6,404,476, and 6,404,480 (Apr. 28, 2003).
SEL's Response to the Court's Apr. 28, 2003 Tentative Claim Construction Order (May 5, 2003).
Partial Objection of Defendant AU Optronis Corporation to the Tentative Claim Construction Order for United States Patent Nos. 5,929,527, 6,355,941, 6,404,476, and 6,404,480 and Request for Modification (May 5, 2003).
Acer Incorporated and Acer America Corporation's Comments on Tentative Claim Construction Order (May 5, 2003).
AU Optronics' Objection to Submission of Improper Extrinsic Evidence with SEL's Response to the Court's Apr. 28, 2003 Tentative Claim Construction Order (May 6, 2003).
Acer Incorporated and Acer America Corporation's Preliminary Proposed Constructions of Identified Claim Terms (Dated: Jan. 27, 2003).
Preliminary Proposed Construction of Identified Claim Terms by AU Optronics Corporation (Dated: Jan. 27, 2003).
SEL's Proposed Preliminary Claim Constructions and Extrinsic Evidence (Dated: Jan. 27, 2003).
Joint Claim Construction and Prehearing Statement (Dated Feb. 3, 2003).
Acer America Corporation's answer to first amended complaint for patent infringement and counterclaims, Case No. C02-02800 WHA, District Court for the Northern District of California, filed Sep. 24, 2002.
Acer Corporation's answer to first amended complaint for patent infringement and counterclaims, Case No. C02-02800 WHA, District Court for the Northern District of California, filed Sep. 24, 2002.
AU Optronics Corporation's answer to first amended complaint for patent infringement and counterclaims, Case No. C02-02800 WHA, District Court for Northern District of California, filed Sep. 24, 2002.
Preliminary invalidity contentions of Acer Incorporated, Acer America Corporation and AU Optronics Corporation, Case No. C02-02800 WHA, District Court for the Northern District of California, filed Dec. 3, 2002.
Ikeda Mitsushi, "Large-Size High-Definition TFT-LCDs and Their Bus-Line Technologies", Display and Imaging, vol. 4, pp. 199-206, 1996.
Notification of Reasons for Refusal, Japan Patent Application No. 2003-107359, Mar. 20, 2007, 13 pages including full English translation.
Complaint for Patent Infringement, Demand for Jury Trial, Semiconductor Energy Laboratory Co., Ltd., Plaintiff vs. Chi Mei Optoelectronics Corp., Chi Mei Optoelectronics USA, Inc., Funai Electric Co., Ltd., Funai Corp., Inc., Soyo Group Inc., and Wal-Mart Stores, Inc., Defendants, Case No. 3:07-cv-01667-MHP, dated Mar. 22, 2007.

ELECTRONIC DEVICE AND METHOD FOR MANUFACTURING THE SAME

CROSS-REFERENCE TO RELATED APPLICATIONS

This application is a divisional application of U.S. application Ser. No. 11/142,300, filed Jun. 2, 2005, now U.S. Pat. No. 7,298,021, which is a continuation of U.S. application Ser. No. 10/155,326, filed May 23, 2002, now U.S. Pat. No. 6,940,094, which is a divisional of U.S. application Ser. No. 09/302,679, filed Apr. 30, 1999, now U.S. Pat. No. 6,979,882, which is a continuation of U.S. application Ser. No. 08/895,432, filed Jul. 16, 1997, now U.S. Pat. No. 5,929,527, which claims the benefit of a foreign priority application filed in Japan as Serial No. 8-205417 on Jul. 16, 1996. The disclosures of the prior applications are considered part of (and are incorporated by reference in) the disclosure of this application.

BACKGROUND OF THE INVENTION

1. Field of the Invention

The present invention relates to an electronic device whose electrodes and wiring are constructed by aluminum or a material containing aluminum as the principal component. It also relates to a method for manufacturing the same.

2. Description of the Related Art

Recently, active-matrix liquid crystal devices equipped with large-area image planes are attracting much attention. Such active-matrix liquid crystal devices not only require image planes having larger area, but also demand for finer patterning.

The use of a material having low electric resistance for the wiring material is necessary to fulfill the demand above, because the delay of signal propagating on wiring becomes a problem in a device with a size of 10×10 inch$^2$ or larger.

Concerning a wiring material having low electric resistance, aluminum is the most desirable one. However, aluminum brings about the problem of heat resistance on its use in the manufacturing method (refer to a review paper in *Display and Imaging*, 4 (1996), pp. 199-206; published by *Science Communications International*).

More specifically, in the steps such as the formation of various types of thin films by deposition and the annealing of the resulting films, or in the irradiation of laser light and the implantation of impurity ions, aluminum undergoes problematic abnormal growth so as to form protrusions called hillock or whisker. These hillock and whisker are believed to be attributable to the poor heat resistance of aluminum.

Those protrusions known as hillock or whisker sometimes grow as long as 1 μm or even longer. This phenomenon leads to the occurrence of short circuit between wirings.

The problem above can be prevented from occurring by forming an anodic oxide film on the surface of the aluminum wiring (see the reference above).

According to the study of the present inventors, it is found that the anodic oxide film (assumably containing $Al_2O_3$ as the principal component) is robust and is effective for preventing hillock or whisker from generating. On the other hand, however, such a robust material makes it difficult to form contact holes on the aluminum wiring.

SUMMARY OF THE INVENTION

In the light of the aforementioned circumstances, an object of the present invention is to overcome the problem of heat resistance of an aluminum wiring, and to provide a technique which solves the difficulty in forming contact holes on the aluminum wiring having an anodic oxide film formed thereon.

According to one constitution of the present invention, there is provided an electronic device characterized in that it comprises a film pattern made of aluminum or a material containing aluminum as the principal component thereof, wherein the film made of aluminum or a material containing aluminum as the principal component contains oxygen atoms at a concentration of $8\times10^{18}$ atoms·cm$^{-3}$ or less, carbon atoms at a concentration of $5\times10^{18}$ atoms·cm$^{-3}$ or less, and nitrogen atoms at a concentration of $7\times10^{17}$ atoms·cm$^{-3}$ or less.

By employing the constitution above, the maximum height of the generated protrusions such as hillock and whisker can be suppressed to 500 Å or less.

According to another constitution of the present invention, there is provided a method for manufacturing an electronic device comprising a film pattern made of aluminum or a material containing aluminum as the principal component thereof, wherein the film made of aluminum or a material containing aluminum as the principal component contains oxygen atoms at a concentration of $8\times10^{18}$ atoms·cm$^{-3}$ or less, carbon atoms at a concentration of $5\times10^{18}$ atoms·cm$^{-3}$ or less, and nitrogen atoms at a concentration of $7\times10^{17}$ atoms·cm$^{-3}$ or less; and the film pattern is subjected to a process whose process temperature is 400° C. or lower.

By controlling the process temperature to 400° C. or lower, it is possible to make the best of the effect of controlling the concentration of oxygen, carbon, and nitrogen atoms to a desired low level.

DESCRIPTION OF THE PREFERRED EMBODIMENT

Figure 1A:
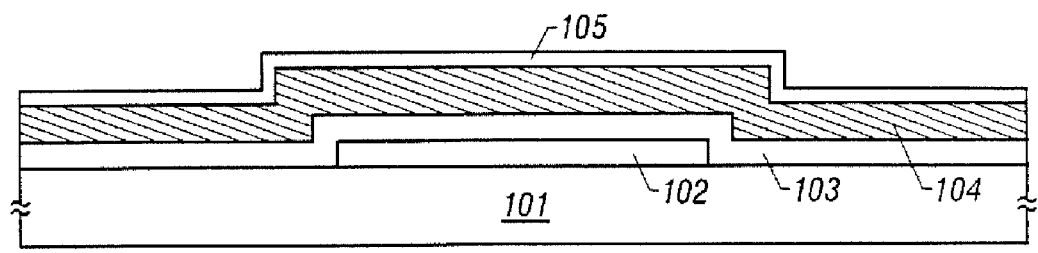
FIGS. 1A to 1C are diagrams showing the steps of manufacturing a thin film transistor.
Figure 1B:
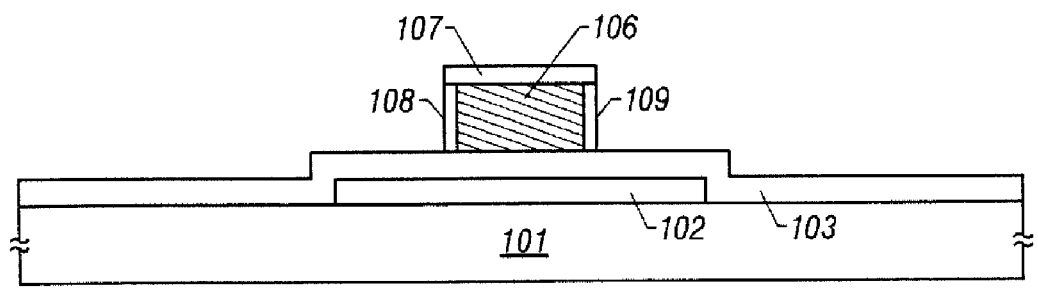

Referring to FIG. 1B, an embodiment of the present invention comprises forming a silicon nitride film 107 on the upper plane of a patterned aluminum film 106 containing $8\times10^{18}$ atoms·cm$^{-3}$ or less of oxygen atoms, $5\times10^{18}$ atoms·cm$^{-3}$ or less of carbon atoms, and $7\times10^{17}$ atoms·cm$^{-3}$ or less of nitrogen atoms, and also forming anodic oxide films (oxide films) 108 and 109 on the side planes of the patterned aluminum film 106.

By utilizing the constitution above, the formation of protrusions such as hillock and whisker can be suppressed, and contacts can be formed more easily.

The present invention is described in detail referring to the preferred embodiments according to the present invention. It should be understood, however, that the present invention is not to be construed as being limited to the examples below.

EXAMPLE 1

Figure 1C:
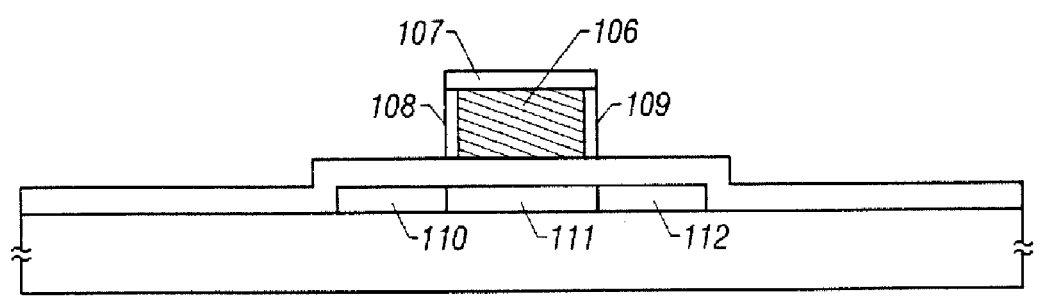

FIGS. 1A to 1C schematically show the fabrication process (cross section) of the present example. The present example refers to a fabrication process of a thin film transistor provided to the pixel matrix portion of an active matrix-type liquid crystal display (generally known as "pixel transistor").

Referring to FIG. 1A, a base film (not shown) is formed on the surface of a glass substrate 101. As the base film (not shown) for use in the present example, a 3,000-Å-thick silicon oxide film is formed by sputtering.

The base film functions to relax the influence of the impurities diffused from the glass substrate and of the minute irregularities on the surface of the glass substrate. Although a glass substrate is used in this example, a quartz substrate can be used in the place thereof.

After forming the base film on the glass substrate 101, a 500-Å-thick amorphous silicon film (not shown), which is the starting film for a semiconductor film that constitutes the active layer 102 of the thin film transistor, is formed by means of plasma CVD.

The resulting amorphous silicon film is subjected to laser irradiation to obtain a crystalline silicon film (not shown). The crystalline silicon film is patterned to form an active layer pattern 102.

Then, a 1,000-Å-thick silicon oxide film 103 which functions as a gate insulating film is formed by means of plasma CVD.

Once the silicon oxide film 103 is obtained, an aluminum film 104 is formed at a thickness of 4,000 Å by sputtering. A silicone nitride film 105 is on the aluminum film 104, Thus is obtained a state as is shown in FIG. 1A.

In the present example, scandium is added into the aluminum film at a concentration of 0.18% by weight.

The addition of scandium suppresses the generation of hillock and whisker in the later steps. Scandium is effective for the preventing hillock and whisker from generating, because it suppresses abnormal growth of aluminum.

Then, a patterned aluminum denoted by a reference numeral 106 is obtained by patterning a layered film of aluminum film 104 and silicon nitride film 105. A silicon nitride film denoted by a reference numeral 107 remains on the gate electrode 106. That is, the patterned aluminum 106 becomes the gate electrode. A gate line is extended from the gate electrode 106.

In the pixel matrix portion, the gate lines extended from the gate electrodes 106 are arranged in a lattice together with source lines to form a matrix.

Anodic oxidation using the gate electrode 106 as the anode is performed thereafter to form anodic oxide films 108 and 109 on the thus exposed side planes of the aluminum film. The anodic oxide film are each provided at a thickness of 500 Å.

In the anodic oxide step above, an ethylene glycol solution containing 3% of tartaric acid, which is neutralized by ammonia water, is used as the electrolytic solution. Thus, an anodic oxide film can be formed by applying electric current to platinum as a cathode and the aluminum film as an anode placed in the electrolytic solution.

The anodic oxide film 108, 109 thus obtained is dense and robust. The film thickness of the film obtained in the anodic oxidation step can be controlled by adjusting the applied voltage.

In the step above, an anodic oxide film is not formed on the upper plane of the gate electrode 106, because the electrolytic solution is brought into contact with only the side planes of the gate electrode 106. Thus is obtained a structure as is shown in FIG. 1B.

A source region 110, a channel region 111, and a drain region 112 are formed thereafter by introducing phosphorus (P) by doping. Plasma doping is used in the present examples a means of doping. A structure shown in FIG. 1C is thus obtained.

Doping of P is performed in this case to fabricate an N-channel type thin film transistor. However, doping of boron (B) must be carried out to fabricate a P-channel type thin film transistor.

The doping step produces such a condition as heating of the sample or inevitable heating of the sample. However, from the viewpoint of the heat resistance of aluminum, it is important to maintain the sample at a temperature of 400° C. or lower. Care should be taken if the heating temperature exceeds 400° C., because the generation of hillock (or whisker; these are not clearly distinguished from each other) becomes apparent.

Upon completion of the doping step, laser light is irradiated to the resulting structure to activate the dopant and the doped region simultaneously.

Figure 2A:
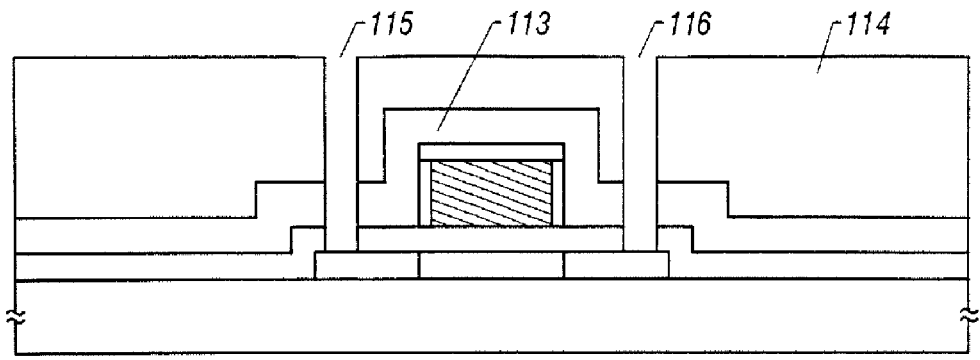
FIGS. 2A to 2C are diagrams showing the steps of manufacturing a thin film transistor.

A 2,000-Å-thick silicon nitride film 113 is formed thereafter by means of plasma CVD to provide a first interlayer insulating film (FIG. 2A).

A polyimide film 114 is formed thereafter by means of spin coating to provide a second interlayer insulating film. A planar surface can be obtained by using polyimide for the interlayer insulating film.

Contact holes 115 and 116 for the source and drain regions are formed thereafter. Thus is obtained a structure as is shown in FIG. 2A.

Figure 2B:
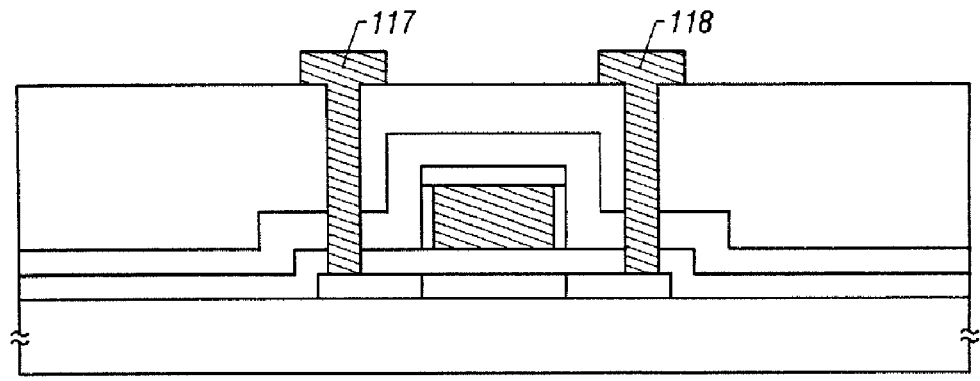

Then, a layered film consisting of titanium film, aluminum film, and titanium film in this order is formed by sputtering, and is patterned to obtain a source electrode 117 and a drain electrode 118. Thus is obtained a structure as is shown in FIG. 2B.

Figure 2C:
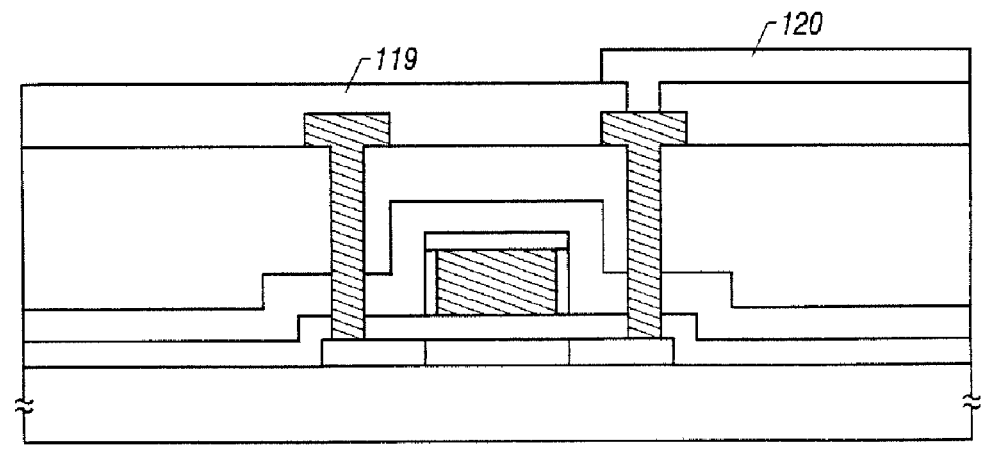

A third interlayer insulating film 119 is formed by using polyimide. After forming a contact hole to the drain electrode 118 thereafter, an ITO pixel electrode 120 is formed. The resulting structure is shown in FIG. 2C.

Thus, a complete thin film transistor is implemented by performing heat treatment under gaseous hydrogen to compensate for the defects that are present inside the active layer.

EXAMPLE 2

The present example refers to a process to be carried out simultaneously with the fabrication process described in Example 1; more specifically, it relates to a process for manufacturing a thin film transistor to be equipped in a peripheral drive circuit that is formed in the periphery of the pixel matrix portion. The present example again describes a process for manufacturing an N-channel type thin film transistor.

The steps in manufacturing the thin film transistor according to the present example are the same as those described in Example 1 with reference to FIGS. 1A to 1C (as a matter of course, there are some differences concerning the wiring pattern and the size of the active layer pattern).

First, a structure with reference to FIG. 1C is obtained by following the steps described in Example 1. Then, referring to FIG. 3A, a silicon nitride film 113 is formed as a first interlayer insulating film.

A polyimide layer 114 is formed as a second interlayer insulating film. Contact holes 301, 302, and 303 are formed thereafter.

Because there is not anodic oxide film but a silicon nitride film formed on the upper plane of the gate electrode 106, the contact hole 302 can be formed easily thereon.

Figure 3A:
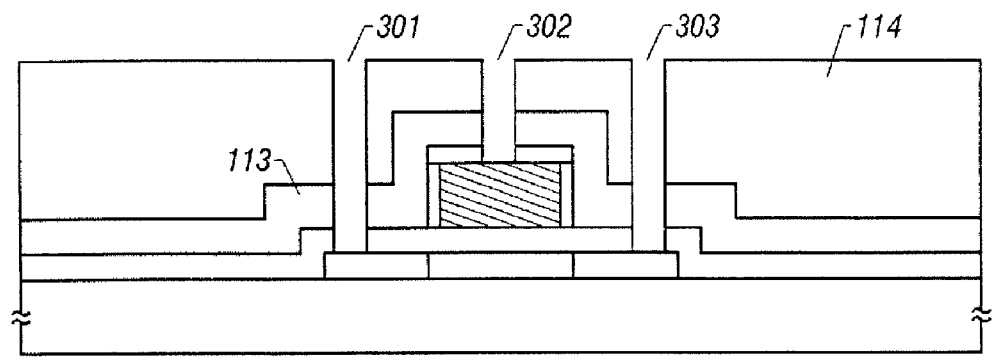
FIGS. 3A and 3B are diagrams showing the steps of manufacturing a thin film transistor.

In the constitution according to the present example, contact holes 301, 302, and 303 are formed at the same time by using dry etching. Thus is obtained a structure as is shown in FIG. 3A.

Figure 3B:
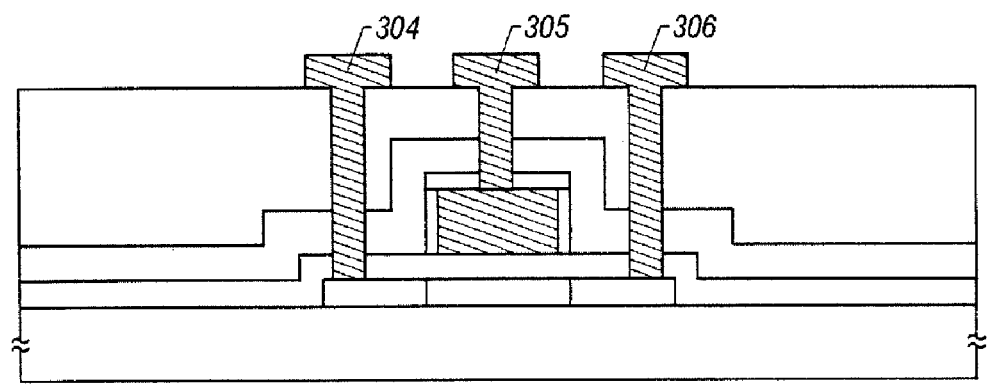

A three-layered film consisting of titanium film, aluminum film, and titanium film is formed by sputtering. A source electrode 304, a gate lead electrode 305, and a drain electrode 306 are formed by patterning the resulting three-layered film. The structure shown in FIG. 3B is obtained in this manner.

Then, a hydrogenation step similar to that described in Example 1 is performed to complete a thin film transistor.

Steps for manufacturing an N-channel type thin film transistor are described in the description above. In general, an N-channel type thin film transistor and a P-channel type thin film transistor disposed in a complementary arrangement are used for a peripheral drive circuit.

EXAMPLE 3

The present example refers to a process for manufacturing a thin film transistor comprising a low concentration impurity region interposed between a channel region and a drain region.

FIGS. 4A to 4C and FIGS. 5A to 5C show the steps for manufacturing a thin film transistor according to the present example. First, a base film (not shown) is formed on the surface of a glass substrate 401. Then, an amorphous silicon film is formed, and is crystallized by irradiating a laser radiation. Thus is obtained a crystalline silicon film. The resulting crystalline silicon film is patterned to form an active layer 402 for the thin film transistor.

Then, a silicon oxide film 403 which functions as a gate insulating film is formed, and an aluminum film 404 is formed thereafter.

A silicon nitride film 405 is formed on the aluminum film. Thus is obtained a structure shown in FIG. 4A.

Figure 4A:
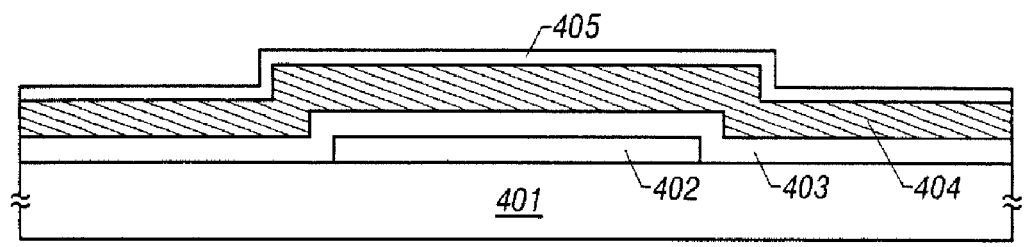
FIGS. 4A to 4C are diagrams showing the steps of manufacturing another thin film transistor.
Figure 4B:
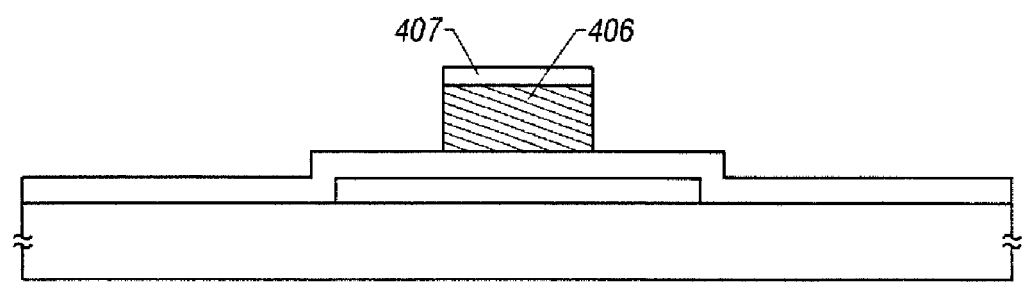

An aluminum pattern 406 is obtained by applying patterning to the structure with reference to FIG. 4A. The resulting aluminum pattern is the base pattern of the gate electrode that is to be formed later. A remaining silicon nitride pattern is also shown by a reference numeral 407. Thus is obtained a structure as is shown in FIG. 4B.

Anodic oxidation is performed thereafter to form anodic oxide films 409 and 410 by using the aluminum pattern 406 as the anode.

Figure 4C:
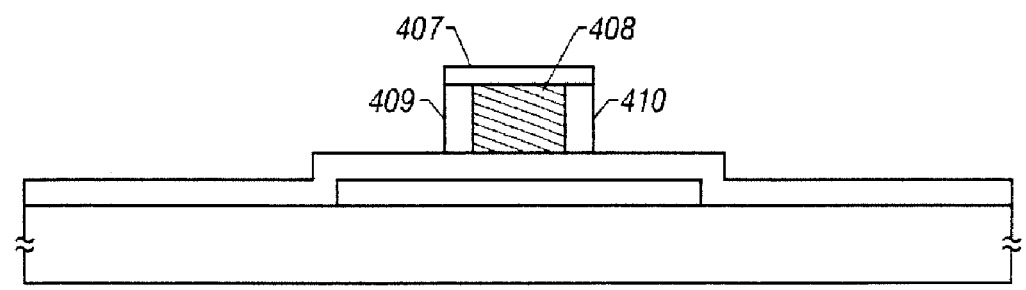

In the present example, an aqueous 3% oxalic acid solution is used as the electrolytic solution. The anodic oxide film formed in this step is porous, and can be grown to a growth length of several micrometers. The growth length can be controlled by adjusting the duration of anodic oxidation. Thus is obtained a structure as is shown in FIG. 4C, in which the pattern 408 becomes the gate electrode.

Figure 5A:
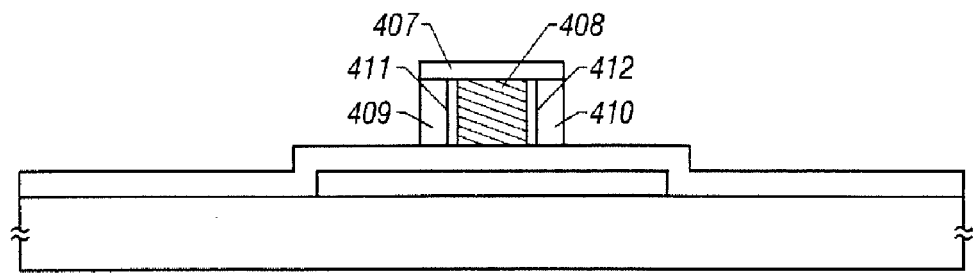
FIGS. 5A to 5C are diagrams showing the steps of manufacturing another thin film transistor.

Then, anodic oxidation is performed again. In this case, anodic oxidation is performed under the same conditions as those employed in forming dense anodic oxide films in Example 1. Thus are obtained dense anodic oxide films 411 and 412 as shown in FIG. 5A.

The dense anodic oxide films 411 and 412 are formed at a thickness of 500 Å. The dense anodic oxide films are formed selectively on the side planes of the gate electrode 408, because a silicon nitride film 407 is formed previously on the upper plane of the gate electrode 408. Furthermore, because the electrolytic solution permeates the porous anodic oxide films 409 and 410, dense anodic oxide films 411 and 412 are formed as shown in FIG. 5A.

Figure 5B:
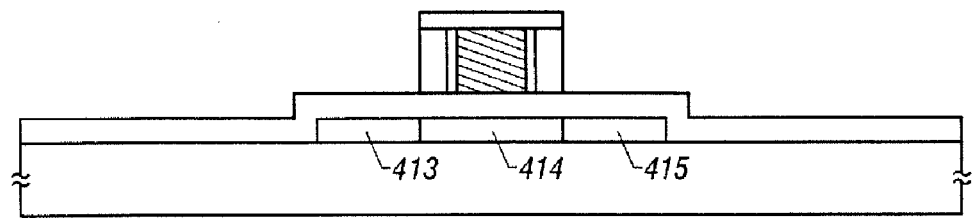

Phosphorus (P) atoms are implanted thereafter by employing plasma doping in the present example. Thus are formed a source region 413, an I-type region 414, and a drain region 415 in a self-aligned manner as is shown in FIG. 5B.

Figure 5C:
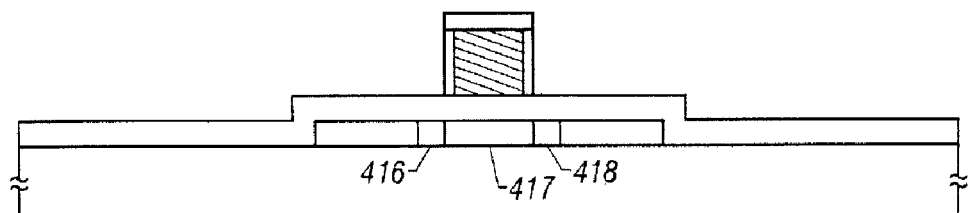

Then, the porous anodic oxide films 409 and 410 are removed selectively. Referring to FIG. 5C, a part of the silicon nitride film 407 on the upper portion of the anodic oxide films 409 and 410 is removed together with the anodic oxide films.

Subsequently, doping of P atoms is performed again. In the present step, the dosing is carried out at a dose lower than that employed in the previous doping step. In the present step, low concentration impurity regions 416 and 418 are formed in a self-aligned manner, and a channel forming region 417 is also formed in a self-aligned manner.

The low concentration impurity regions 416 and 418 contain phosphorus (P) at a concentration lower than that for the source region 413 or the drain region 415.

In general, the low concentration impurity region 418 on the drain region side is called as "LDD (lightly doped drain) region".

Once a structure as shown in FIG. 5C is obtained, laser light is irradiated to thereby anneal the region subjected to doping.

In the constitution described in the present example, the upper plane of the gate electrode (and the gate line extending therefrom) is covered by a silicon nitride film, and the side plane thereof is covered by a dense anodic oxide film. By employing such a constitution, the generation of hillock or whisker on the surface of the gate electrode can be suppressed during the steps of doping impurity and irradiating laser radiation. Moreover, in such a structure, contacts to gate electrodes (or gate lines) can be formed more easily.

EXAMPLE 4

The present example refers to a thin film transistor of a so-called bottom-gate type constitution, in which the gate electrode is provided between the active layer and the substrate.

FIGS. 6A to 6D and FIGS. 7A and 7B show the steps for manufacturing a thin film transistor according to the present example. First, a 3,000-Å-thick aluminum film 602 is formed on the surface of a glass substrate 601 by means of sputtering. The resulting aluminum film constitutes the gate electrode in the later steps.

Once the aluminum film 602 is formed, a 500-Å-thick silicon nitride film 603 is formed thereon by plasma CVD. Thus is obtained a structure shown in FIG. 6A.

A gate electrode 604 is formed thereafter by patterning. Silicon nitride film 605 remains on the gate electrode 604. The structure shown in FIG. 63 is obtained in this manner.

Dense anodic oxide films 606 and 607 are each formed at a thickness of 500 Å by effecting anodic oxidation using the gate electrode 604 as the anode.

Figure 6A:
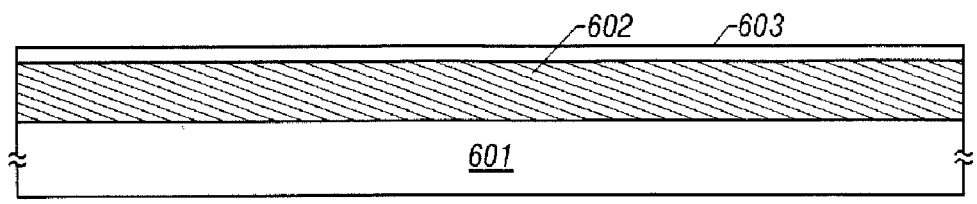
FIGS. 6A to 6D are diagrams showing the steps of manufacturing a still other thin film transistor.
Figure 6B:
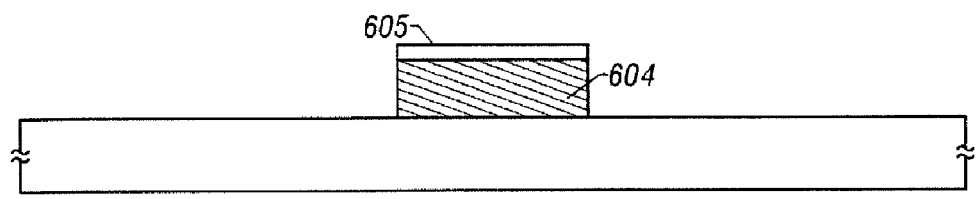
Figure 6C:
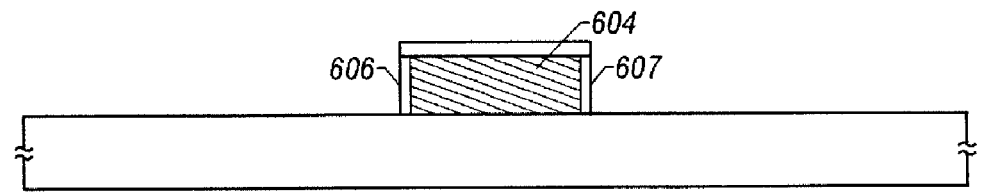

Because silicon nitride film 605 still remains in this step, anodic oxide films are formed on only the side planes of the gate electrode 604. Thus is obtained a structure as shown in FIG. 6C.

A 1,000-Å-thick silicon oxide film 608 which functions as a gate insulating film is formed thereafter by means of plasma CVD. In order to form an active layer, a 500-Å-thick amorphous silicon film (not shown) is formed by plasma CVD. A crystalline silicon film (not shown) is obtained thereafter by irradiating a laser light to the amorphous silicon film.

Once the crystalline silicon film (not shown) is obtained, patterning is performed to form an active layer pattern comprising regions 609, 610, and 611.

Figure 6D:
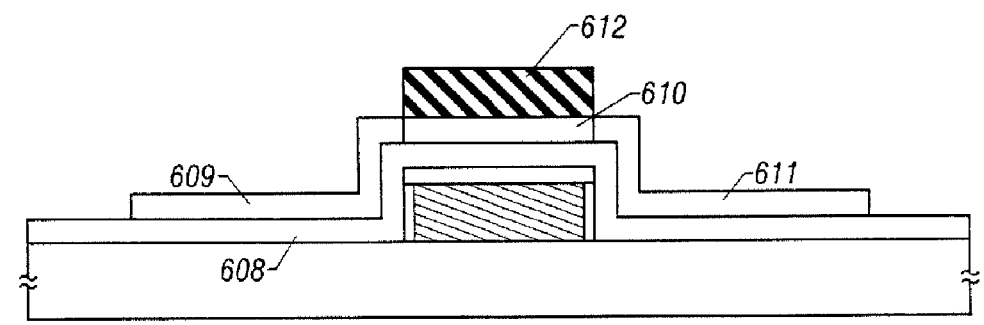

Then, a resist mask 612 is formed by performing exposure from the back side of the substrate 601 while using the gate electrode 604 as a mask (see FIG. 6D).

In this state, plasma doping is performed to dope P atoms. Thus, a source region 609, a drain region 611, and a channel region 610 are formed in a self-aligned manner in the present doping step. Thus is obtained a structure shown in FIG. 6D.

Upon completion of the doping step above, laser light is irradiated to the structure to activate the doped atoms and to anneal the doped regions.

Figure 7A:
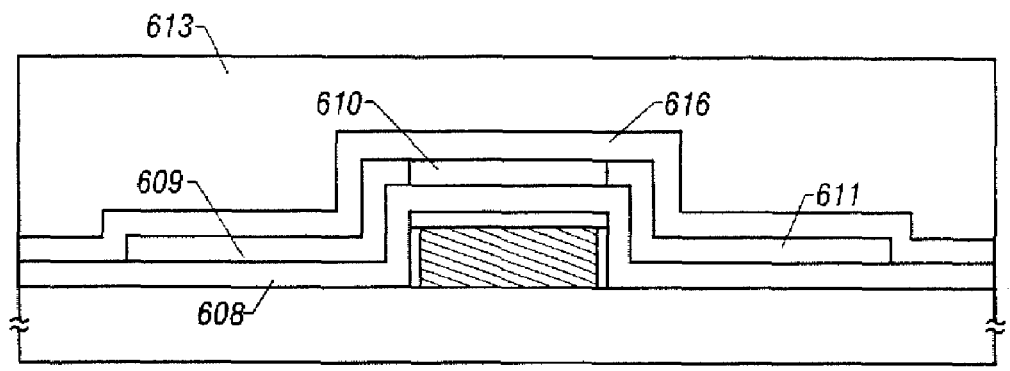
FIGS. 7A and 7B are diagrams showing the steps of manufacturing a still other thin film transistor.
Figure 7B:
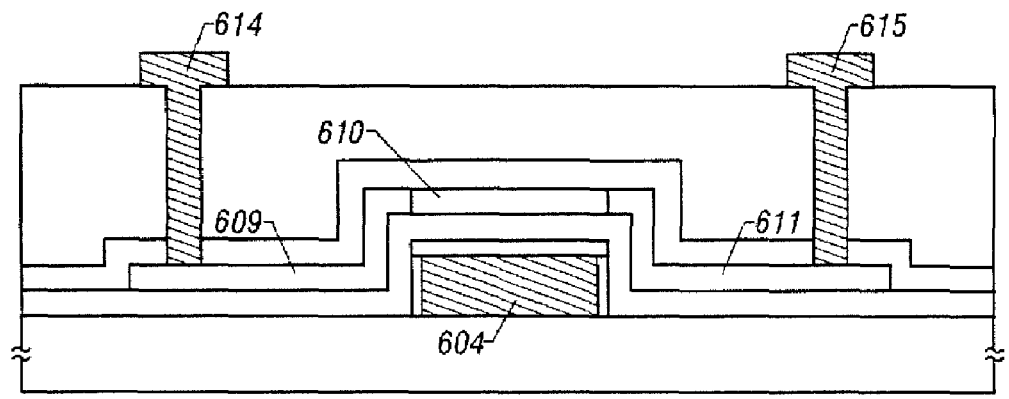

Then, a 2,000-Å-thick silicon nitride film is formed by plasma CVD to provide a first interlayer insulating film 612, and a polyimide film is formed thereafter to obtain a second interlayer insulating film 613. The structure thus obtained is shown in FIG. 7A.

After perforating contact holes, a source electrode 614 and a drain electrode 615 are formed. Hydrogenation is performed finally to complete the transistor.

Although not shown, another contact to the gate electrode 604 is formed by perforating a contact hole on the upper portion of wiring extended from the gate electrode 604 in a separate portion. Thus is obtained a structure shown in FIG. 7B.

Also in the constitution of the present example, hillock and whisker are prevented from generating as a whole because an anodic oxide film is formed on the side planes of the gate electrode 604 and because a silicon nitride film is formed on the upper plane of the gate electrode 604. Moreover, because a silicon nitride film is formed on the upper plane of the gate electrode, the formation of contact holes is facilitated.

EXAMPLE 5

The relation between the concentration of impurities in an aluminum film containing 0.18% by weight of scandium and the generation of hillock is shown in this example. A 3,000-Å-thick aluminum film was formed by sputtering, and was subjected to heat treatment at 350° C. for a duration of 1 hour under gaseous hydrogen atmosphere. Table 1 shows the relation between the observed height of the hillock and the concentration of impurities in the thus obtained film.

TABLE 1

| No. | Impurity concentration Sample in film Nos. (atoms · cm$^{-3}$) (max. value) | | | Maximum height of Hillock (Å) |
|---|---|---|---|---|
| | Oxygen | Carbon | Nitrogen | |
| 1 | $2 \times 10^{20}$ | $9 \times 10^{19}$ | $1 \times 10^{19}$ | 1552 |
| 2 | $7 \times 10^{19}$ | $4 \times 10^{19}$ | $7 \times 10^{18}$ | 1627 |
| 3 | $7 \times 10^{19}$ | $2 \times 10^{19}$ | $5 \times 10^{18}$ | 2472 |
| 4 | $1 \times 10^{19}$ | $8 \times 10^{18}$ | $2 \times 10^{18}$ | 837 |
| 5 | $8 \times 10^{18}$ | $4 \times 10^{18}$ | $6 \times 10^{17}$ | 322 |
| 6 | $7 \times 10^{18}$ | $4 \times 10^{18}$ | $7 \times 10^{17}$ | 481 |
| 7 | $7 \times 10^{18}$ | $5 \times 10^{18}$ | $7 \times 10^{17}$ | 373 |

Referring to Table 1, the concentration of impurities differs from a sample to another. The difference arises due to factors such as the varied duration of evacuation during sputtering, whether or not cleaning of chamber of the sputtering apparatus was performed, and how maintenance was carried out on the evacuation pump.

The height of the hillock was determined by observation under cross section SEM (scanning electron microscope) and AFM (atomic force microscope). The concentration of impurity elements is given by the maximum value measured by using SIMS (secondary ion mass spectroscopy).

It is apparent from Table 1 that the generation of hillock can be suppressed by decreasing the concentration of oxygen (O), carbon (C), and nitrogen (N) contained in the film.

By taking into consideration the film thickness of the interlayer insulating film and the like, hillock not greater than 500 Å in height are allowable in view of practical use. Conclusively, Table 1 reads that the allowable concentration of the impurities is $7 \times 10^{18}$ atoms·cm$^{-3}$ or lower for oxygen, $5 \times 10^{18}$ atoms·cm$^{-3}$ or lower for carbon, and $7 \times 10^{17}$ atoms·cm$^{-3}$ or lower for nitrogen.

Care should be taken in using SIMS for the measurement of the impurity concentration, because a false value is sometimes measured in the vicinity of the interface of the film.

Explanation of the Apparatus

Figure 8:
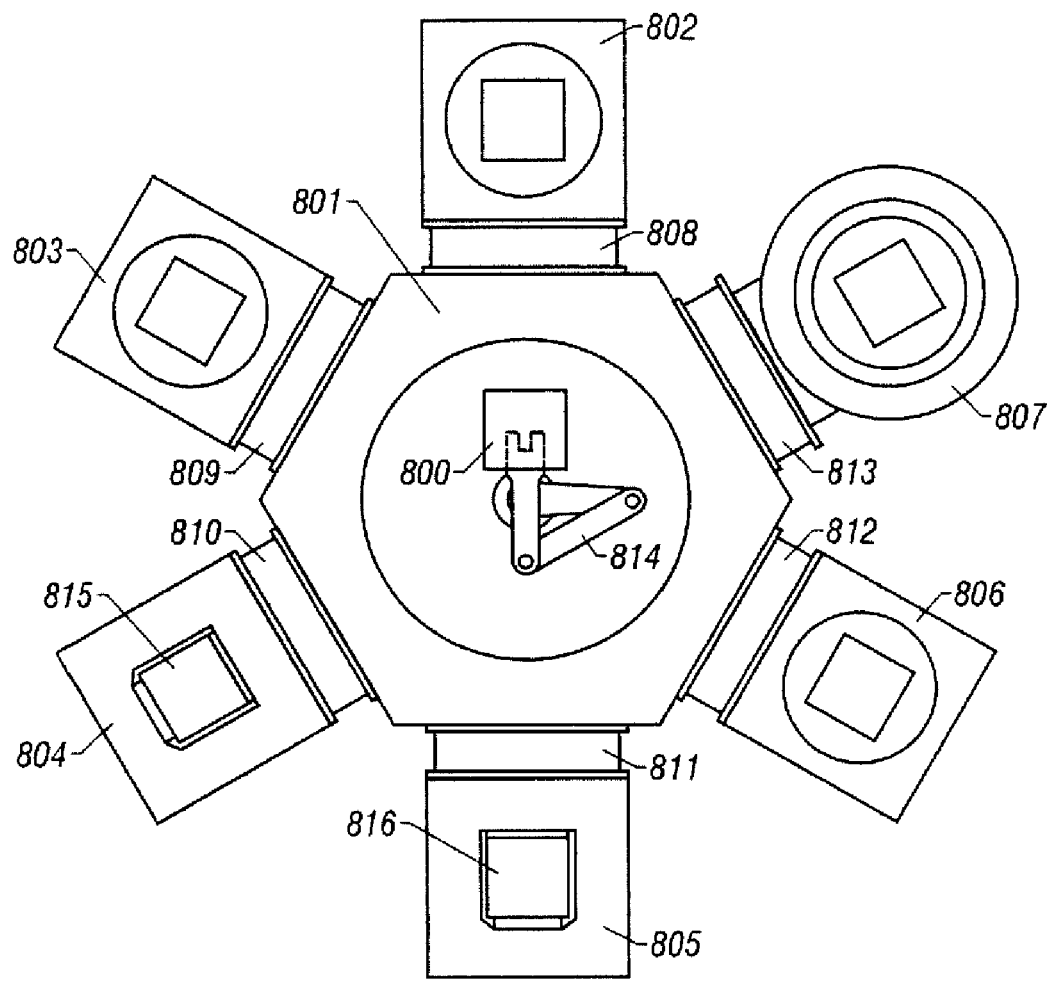
FIG. 8 is a schematic of a film deposition apparatus.

The apparatus for use in an embodiment of the present invention is described below. FIG. 8 schematically shows the apparatus. Referring to FIG. 8, the apparatus is of a multi-chamber type in which a plurality of processes are performed continuously without exposing the sample to the atmosphere. Each of the chambers is equipped with the necessary evacuation system, and maintains the airtight environment.

Referring to FIG. 8, the apparatus comprises a substrate feeding chamber 804 and a substrate discharging chamber 805. A plurality of substrates (samples) set in a cassette 815 are wholly fed into the substrate feeding chamber 804 from the outside. The substrates subjected to the process are set again in a cassette 816, and once process for a predetermined number of substrates are finished, the cassette 816 with such substrates is wholly drawn again from the chamber.

A substrate transportation chamber 801 transports a substrate 800 to a desired chamber by using a robot arm 814.

A chamber 803 is provided to form aluminum films by means of sputtering. The chamber 803 is equipped with a cryo pump to control the concentration of impurities in the aluminum film to a predetermined level or lower.

A sputtering apparatus 802 is used to form a germanium (or silver) film to realize favorable electric contact in forming contacts. The chamber 802 is also equipped with a cryo pump to prevent the incorporation of impurities as much as possible.

A chamber 807 is provided to perform heat treatment. In this chamber, heating is effected by irradiating a light emitted from a lamp.

A chamber 806 is further provided to form a silicon nitride film by using plasma CVD.

Gate valves, which are gate-type sections or partitions 810, 809, 808, 813, 812, and 811, are provided between the substrate transportation chamber 801 and each of the peripheral chambers for performing various types of processes.

An example of operating the apparatus with reference to FIG. 8 is described below. The present operation comprises sequential processes of forming an aluminum film by film deposition, forming a germanium film, heat treatment, and forming a silicon nitride film.

In the processes, the gate valves are all closed except for the one through which the sample is passed. First, a plurality of substrates (samples) for forming thereon an aluminum film are set inside a cassette 815, and are transported into the substrate feeding chamber 804. A substrate is then transported into the chamber 803 by using the robot arm 814.

Upon completion of the formation of the aluminum film inside the chamber 803, the substrate is transferred to the chamber 806 to form thereon a silicon nitride film. Then, the substrate is placed inside the cassette 816 of the substrate discharging chamber 805 to complete the entire process.

In case of forming an aluminum film for use as the contact after the formation of contact holes, a germanium film is formed inside the chamber 802 after forming the aluminum film in the chamber 803, and thereafter heat treatment is carried out in the heating chamber 807 to perform reflow treatment, i.e., the annealing for forming the contact.

Reflow treatment provides a favorable electric contact between aluminum and the electrode to be brought into contact therewith (i.e., the electrode exposed at the bottom portion of the contact hole), because the melting point drops at the contact portion between aluminum and germanium, and germanium thereby diffuses into the aluminum film by the heat treatment.

EXAMPLE 6

The present example relates to a case of employing, in the place of anodic oxidation, plasma oxidation for the formation of a metallic oxide film on the surface of aluminum. Plasma oxidation can be performed by effecting high frequency discharge under a reduced-pressure oxidizing atmosphere.

EXAMPLE 7

The present invention disclosed in the present specification is applicable to an active matrix electro-optical device. Electro-optical devices include, for instance, a liquid crystal display device, an EL (electro-luminescent) display device, and an EC (electro-chromic) display device.

Application examples of the commercially available products include TV cameras, personal computers, car navigation systems, TV projection systems, video cameras, etc. Those products are briefly described below with reference to FIGS. 9A to 9E.

Figure 9A:
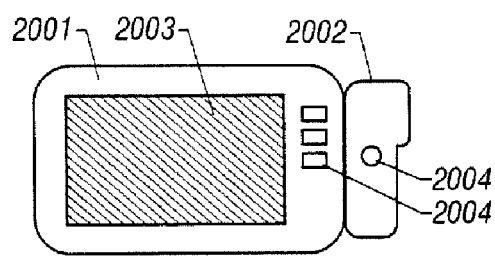
FIGS. 9A to 9E schematically show devices utilizing liquid crystal panels.

FIG. 9A shows a TV camera comprising a main body 2001, a camera 2002, a display device 2003, and operation switches 2004. The display device 2003 is also used as a view finder.

Figure 9B:
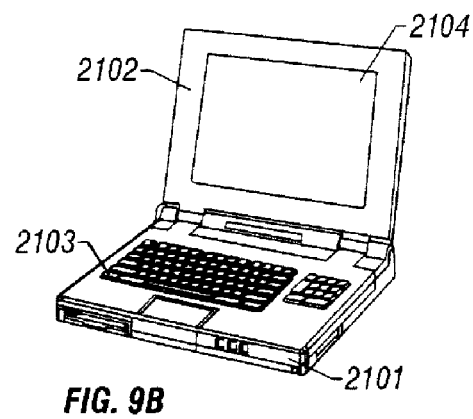

FIG. 9B shows a personal computer comprising a main body 2101, a cover 2102, a keyboard 2103, and a display device 2104. The display device 2104 is used as a monitor, and a diagonal of ten and several inches in size is required.

Figure 9C:
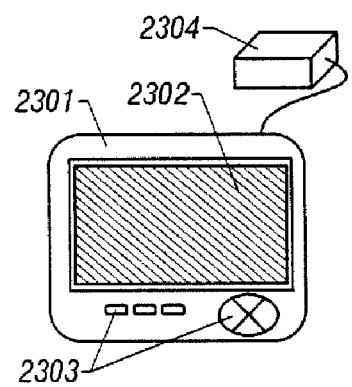

Referring to FIG. 9C, a car navigation system comprises a main body 2301, a display device 2302, operation switches 2303, and an antenna 2304. The display device 2302 is used as a monitor, but the main usage thereof is to display a map. Thus, the allowance in resolution is relatively large.

Figure 9D:
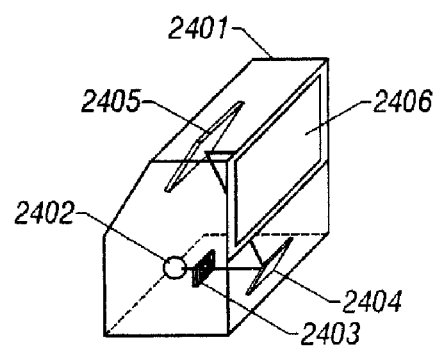

Referring to FIG. 9D, a TV projection system comprises a main body 2401, a light source 2402, a display device 2403, mirrors 2404 and 2405, and a screen 2406. Because the image displayed in the display device 2403 is projected to the screen 2406, the display device 2403 must have high resolution.

Figure 9E:
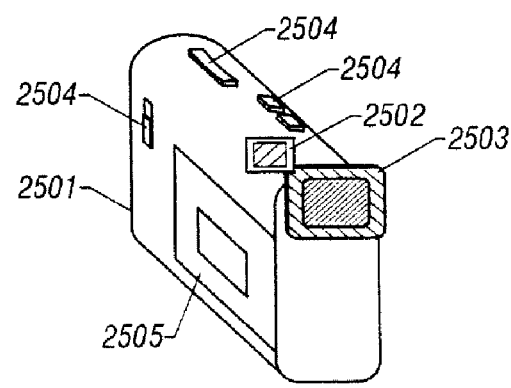

Referring to FIG. 9E, a video camera comprises a main body 2501, a display device 2502, an eye piece 2503, operation switches 2504, and a tape holder 2505. Since the real-time view of the photographed image can be seen through the eye piece 2503, a user may take pictures while viewing the image.

As described above, by using the present invention, not only the problem concerning the heat resistance of an aluminum wiring is overcome, but also the problematic formation of contacts is facilitated in case an anodic oxidation film is formed.

Although aluminum is used for the gate electrode and the gate line in the foregoing embodiments, the present invention is applicable to anodic oxidizable metals such as tantalum in place of aluminum.

While the invention has been described in detail, it should be understood that the present invention is not to be construed as being limited thereto, and that any modifications can be made without departing from the scope of claims.

What is claimed is:

1. An active matrix display device comprising:
    a plurality of first wirings extending in a first direction over a substrate;
    a plurality of second wirings extending in a second direction across the first direction over the substrate so as to form a matrix with the plurality of first wirings;
    a plurality of pixels defined by the plurality of first wirings and the plurality of second wirings;
    a thin film transistor formed in one of the plurality of pixels, the thin film transistor being electrically connected to one of the plurality of first wirings and one of the plurality of second wirings; and
    a pixel electrode electrically connected to the thin film transistor,
    wherein the one of the plurality of first wirings comprises aluminum and contains oxygen atoms at a concentration of $8 \times 10^{18}$ atoms/cm$^3$ or less, carbon atoms at a concentration of $5 \times 10^{18}$ atoms/cm$^3$ or less, and nitrogen atoms at a concentration of $7 \times 10^{17}$ atoms/cm$^3$ or less.

2. The active matrix display device according to claim 1 wherein the one of the plurality of first wirings is a single conductive layer.

3. The active matrix display device according to claim 1 wherein the one of the plurality of first wirings is a gate line and the one of the plurality of second wirings is a source line.

4. The active matrix display device according to claim 1 wherein the one of the plurality of second wirings comprises aluminum.

5. The active matrix display device according to claim 1 wherein the one of the plurality of first wirings is provided with an anodic oxide film.

6. The active matrix display device according to claim 1 wherein the thin film transistor comprises a semiconductor layer including a channel forming region formed over the substrate and a gate electrode formed over the semiconductor layer with a gate insulating film interposed therebetween.

7. An active matrix display device comprising:
    a plurality of first wirings extending in a first direction over a substrate;
    a plurality of second wirings extending in a second direction across the first direction over the substrate so as to form a matrix with the plurality of first wirings;
    a plurality of pixels defined by the plurality of first wirings and the plurality of second wirings;
    a thin film transistor formed in one of the plurality of pixels, the thin film transistor comprising a gate electrode formed over the substrate and a semiconductor layer including a channel forming region formed over the gate electrode with a gate insulating film interposed therebetween, wherein the thin film transistor is electrically connected to one of the plurality of first wirings and one of the plurality of second wirings; and
    a pixel electrode electrically connected to the thin film transistor,
    wherein the one of the plurality of first wirings comprises aluminum and contains oxygen atoms at a concentration of $8 \times 10^{18}$ atoms/cm$^3$ or less, carbon atoms at a concentration of $5\times10^{18}$ atoms/cm$^3$ or less, and nitrogen atoms at a concentration of $7\times10^{17}$ atoms/cm$^3$ or less.

8. The active matrix display device according to claim 7 wherein the one of the plurality of first wirings is a single conductive layer.

9. The active matrix display device according to claim 7 wherein the one of the plurality of first wirings is a gate line and the one of the plurality of second wirings is a source line.

10. The active matrix display device according to claim 7 wherein the one of the plurality of second wirings comprises aluminum.

11. The active matrix display device according to claim 7 wherein the one of the plurality of first wirings is provided with an anodic oxide film.

12. An active matrix display device comprising:
a plurality of first wirings extending in a first direction over a substrate;
a plurality of second wirings extending in a second direction across the first direction over the substrate so as to form a matrix with the plurality of first wirings;
a plurality of pixels defined by the plurality of first wirings and the plurality of second wirings;
a thin film transistor formed in one of the plurality of pixels, the thin film transistor being electrically connected to one of the plurality of first wirings and one of the plurality of second wirings;
an interlayer insulating film comprising silicon nitride formed over the thin film transistor; and
a pixel electrode formed over the interlayer insulating film and electrically connected to the thin film transistor,
wherein the one of the plurality of first wirings comprises aluminum and contains oxygen atoms at a concentration of $8\times10^{18}$ atoms/cm$^3$ or less, carbon atoms at a concentration of $5\times10^{18}$ atoms/cm$^3$ or less, and nitrogen atoms at a concentration of $7\times10^{17}$ atoms/cm$^3$ or less.

13. The active matrix display device according to claim 12 wherein the one of the plurality of first wirings is a single conductive layer.

14. The active matrix display device according to claim 12 wherein the one of the plurality of first wirings is a gate line and the one of the plurality of second wirings is a source line.

15. The active matrix display device according to claim 12 wherein the one of the plurality of second wirings comprises aluminum.

16. The active matrix display device according to claim 12 wherein the one of the plurality of first wirings is provided with an anodic oxide film.

17. The active matrix display device according to claim 12 wherein the thin film transistor comprises a semiconductor layer including a channel forming region formed over the substrate and a gate electrode formed over the semiconductor layer with a gate insulating film interposed therebetween.

18. The active matrix display device according to claim 12 wherein the interlayer insulating film comprising silicon nitride is located between the one of the plurality of first wirings and the one of the plurality of second wirings.

19. An active matrix display device comprising:
a plurality of first wirings extending in a first direction over a substrate;
a plurality of second wirings extending in a second direction across the first direction over the substrate so as to form a matrix with the plurality of first wirings;
a plurality of pixels defined by the plurality of first wirings and the plurality of second wirings;
a thin film transistor formed in one of the plurality of pixels, the thin film transistor comprising a gate electrode formed over the substrate and a semiconductor layer including a channel forming region formed over the gate electrode with, a gate insulating film interposed therebetween, wherein the thin film transistor is electrically connected to one of the plurality of first wirings and one of the plurality of second wirings;
an interlayer insulating film comprising silicon nitride formed over the thin film transistor; and
a pixel electrode formed over the interlayer insulating film and electrically connected to the thin film transistor,
wherein the one of the plurality of first wirings comprises aluminum and contains oxygen atoms at a concentration of $8\times10^{18}$ atoms/cm$^3$ or less, carbon atoms at a concentration of $5\times10^{18}$ atoms/cm$^3$ or less, and nitrogen atoms at a concentration of $7\times10^{17}$ atoms/cm$^3$ or less.

20. The active matrix display device according to claim 19 wherein the one of the plurality of first wirings is a single conductive layer.

21. The active matrix display device according to claim 19 wherein the one of the plurality of first wirings is a gate line and the one of the plurality of second wirings is a source line.

22. The active matrix display device according to claim 19 wherein the one of the plurality of second wirings comprises aluminum.

23. The active matrix display device according to claim 19 wherein the one of the plurality of first wirings is provided with an anodic oxide film.

24. The active matrix display device according to claim 19 wherein the interlayer insulating film comprising silicon nitride is located between the one of the plurality of first wirings and the one of the plurality of second wirings.

* * * * *

UNITED STATES PATENT AND TRADEMARK OFFICE
CERTIFICATE OF CORRECTION

PATENT NO. : 7,446,392 B2
APPLICATION NO. : 11/942346
DATED : November 4, 2008
INVENTOR(S) : Shunpei Yamazaki It is certified that error appears in the above-identified patent and that said Letters Patent is hereby corrected as shown below:

Column 3, line 36, change "film 104," to "film 104.";
Column 6, line 14, change "dosing" to "doping"; and
Column 6, line 55, change "Fig. 63" to "Fig. 6B".

Signed and Sealed this

Eighth Day of June, 2010

David J. Kappos
*Director of the United States Patent and Trademark Office*